(12) United States Patent
Kim et al.

(10) Patent No.: US 10,847,447 B2
(45) Date of Patent: Nov. 24, 2020

(54) SEMICONDUCTOR DEVICE HAVING PLANARIZED PASSIVATION LAYER AND METHOD OF FABRICATING THE SAME

(71) Applicant: SAMSUNG ELECTRONICS CO., LTD., Suwon-si (KR)

(72) Inventors: Young Lyong Kim, Anyang-Si (KR); Seungduk Baek, Hwaseong-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 76 days.

(21) Appl. No.: 16/124,225

(22) Filed: Sep. 7, 2018

(65) Prior Publication Data
US 2019/0244878 A1    Aug. 8, 2019

(30) Foreign Application Priority Data
Feb. 8, 2018 (KR) ........................ 10-2018-0015706

(51) Int. Cl.
*H01L 23/488* (2006.01)
*H01L 23/538* (2006.01)
*H01L 23/00* (2006.01)

(52) U.S. Cl.
CPC ........ *H01L 23/488* (2013.01); *H01L 23/5384* (2013.01); *H01L 23/5386* (2013.01); *H01L 24/14* (2013.01); *H01L 24/11* (2013.01); *H01L 24/13* (2013.01); *H01L 24/16* (2013.01); *H01L 24/17* (2013.01); *H01L 2224/1146* (2013.01); *H01L 2224/1147* (2013.01); *H01L 2224/11849* (2013.01); *H01L 2224/13025* (2013.01); *H01L 2224/13082* (2013.01); *H01L 2224/14133* (2013.01); *H01L 2224/14134* (2013.01); *H01L 2224/14519* (2013.01); *H01L 2224/16145* (2013.01); *H01L 2224/16146* (2013.01);
(Continued)

(58) Field of Classification Search
CPC ............. H01L 23/5385; H01L 23/3675; H01L 2224/16059; H01L 2224/16146
See application file for complete search history.

(56) References Cited

U.S. PATENT DOCUMENTS 5,552,628 A * 9/1996 Watanabe ............. H01L 21/316
257/632
6,245,594 B1    6/2001 Wu et al.
(Continued)

FOREIGN PATENT DOCUMENTS

JP           3241772 B2   12/2001

*Primary Examiner* — Dale E Page
*Assistant Examiner* — Wilner Jean Baptiste
(74) *Attorney, Agent, or Firm* — Volentine, Whitt & Francos, PLLC

(57) ABSTRACT

A semiconductor device includes a semiconductor substrate divided into a pad region and a cell region and having an active surface and an inactive surface opposite to the active surface, a plurality of metal lines on the active surface of the semiconductor substrate, passivation layers on the active surface of the semiconductor substrate, and a plurality of bumps in the cell region. The passivation layers include a first passivation layer covering the plurality of metal lines and having a non-planarized top surface along an arrangement profile of the plurality of metal lines, and a second passivation layer on the non-planarized top surface of the first passivation layer and having a planarized top surface on which the plurality of bumps are disposed.

20 Claims, 12 Drawing Sheets

(52) U.S. Cl.
CPC ............... *H01L 2224/16227* (2013.01); *H01L 2224/17181* (2013.01); *H01L 2224/17519* (2013.01); *H01L 2225/06513* (2013.01); *H01L 2924/15311* (2013.01); *H01L 2924/18161* (2013.01)

(56) References Cited

U.S. PATENT DOCUMENTS

| | | |
|---|---|---|
| 6,352,933 B1 * | 3/2002 | Forbes .............. H01L 21/02164 |
| | | 257/E21.273 |
| 6,627,988 B2 | 9/2003 | Andoh |
| 7,045,900 B2 | 5/2006 | Hikita et al. |
| 9,666,551 B1 | 5/2017 | Seo et al. |
| 2006/0051274 A1 | 3/2006 | Wright et al. |
| 2013/0082090 A1 | 4/2013 | Cho et al. |
| 2013/0127045 A1 | 5/2013 | Lin et al. |
| 2013/0221519 A1 | 8/2013 | Hwang et al. |
| 2015/0091163 A1 | 4/2015 | Kim |
| 2015/0162346 A1 | 6/2015 | Choi et al. |
| 2016/0118326 A1 * | 4/2016 | Kwon ................ H01L 21/4853 |
| | | 257/621 |
| 2017/0125379 A1 * | 5/2017 | Chen .................. H01L 23/5389 |

\* cited by examiner

SEMICONDUCTOR DEVICE HAVING PLANARIZED PASSIVATION LAYER AND METHOD OF FABRICATING THE SAME

PRIORITY STATEMENT

This U.S. nonprovisional application claims priority under 35 U.S.C § 119 to Korean Patent Application No. 10-2018-0015706 filed on Feb. 8, 2018, in the Korean Intellectual Property Office, the entire contents of which are hereby incorporated by reference.

BACKGROUND

The inventive concept relates to a semiconductor device and to a method of manufacturing the same. More particularly, the inventive concept relates to a semiconductor device having micro-bumps, e.g., thermal bumps designed to facilitate the dissipation of heat from a region of a semiconductor device, and to a method of fabricating the same.

Semiconductor packages provide means by which integrated circuits may be easily used in electronic products. Typically, a semiconductor package has a semiconductor is mounted on a printed circuit board (PCB) and bonding wires or bumps electrically connecting the semiconductor chip to the printed circuit board. With the development of the electronics industry, there is a growing interest in standardizing and miniaturizing semiconductor packages. In addition, various studies are underway to increase operating speeds of semiconductor packages. However, the standardizing and miniaturizing of semiconductor packages, as well as the increasing of the operating speed of semiconductor packages, can give rise to certain problems in terms of operational reliability of the chips (ICs) of the resulting packages.

SUMMARY

According to an aspect of the inventive concept, there is provided a semiconductor device having a pad region and at least one cell region discrete from the pad region, and comprising a semiconductor substrate having an active surface and an inactive surface opposite to the active surface, an arrangement of a plurality of metal lines on the active surface of the semiconductor substrate, a plurality of bumps in the at least one cell region, a first passivation layer covering the plurality of metal lines and having a non-planar top surface having a profile dictated by the arrangement of the plurality of metal lines; and a second passivation layer on the non-planarized top surface of the first passivation layer and having a planar top surface, and in which the bumps are disposed on the planar top surface of the second passivation layer.

According to another aspect of the inventive concept, there is provided a semiconductor device having a pad region and at least one cell region discrete from the pad region, and comprising a semiconductor substrate having an active surface and an inactive surface opposite to the active surface, a plurality of metal lines on the active surface of the semiconductor substrate, a plurality of bumps in the at least one cell region, a first passivation layer covering the plurality of metal lines and including a first insulating material, and a second passivation layer including a second insulating material and having a planar top surface, and in which the second insulating material has a composition different from that of the first insulating material, the bumps are disposed on the planar top surface of the second passivation layer, and the first passivation layer and the second passivation layer have an interface that is non-planar.

According to another aspect of the inventive concept, there is provided a method of fabricating a semiconductor device, comprising providing a semiconductor substrate that is divided into a cell region and a pad region and comprising an active surface and an inactive surface opposite to the active surface; forming a plurality of metal lines on the active surface of the semiconductor substrate; forming on the active surface of the semiconductor substrate a first passivation layer that covers the metal lines and has a non-planarized top surface along an arrangement profile of the metal lines; forming a second passivation layer on the non-planarized top surface of the first passivation layer; chemically mechanically polishing the second passivation layer to planarize a top surface of the second passivation layer; and forming a plurality of dummy bumps on the second passivation layer of the cell region.

According to another aspect of the inventive concept, there is provided a semiconductor device having at least one device region in which integrated circuitry of the semiconductor device is provided, and a connection region discrete from the at least one device region and devoid of passive and active electronic components, and comprising a semiconductor substrate having an active surface and an inactive surface opposite to the active surface, at least part of the integrated circuitry being disposed at the active surface of the semiconductor substrate, a dielectric layer on the active surface of the semiconductor substrate, metal lines disposed on an upper surface of the dielectric layer in the device region, a passivation layer disposed on the dielectric layer and in which the metal lines are embedded and having a planar top surface situated over the metal lines, vias extending in the semiconductor substrate in the connection region and electrically connected to the integrated circuitry, and heat dissipating micro-bumps disposed directly on the planar top surface of the passivation layer over the integrated circuitry in the device region and electrically isolated from the integrated circuitry.

DETAILED DESCRIPTION

Figure 1A:
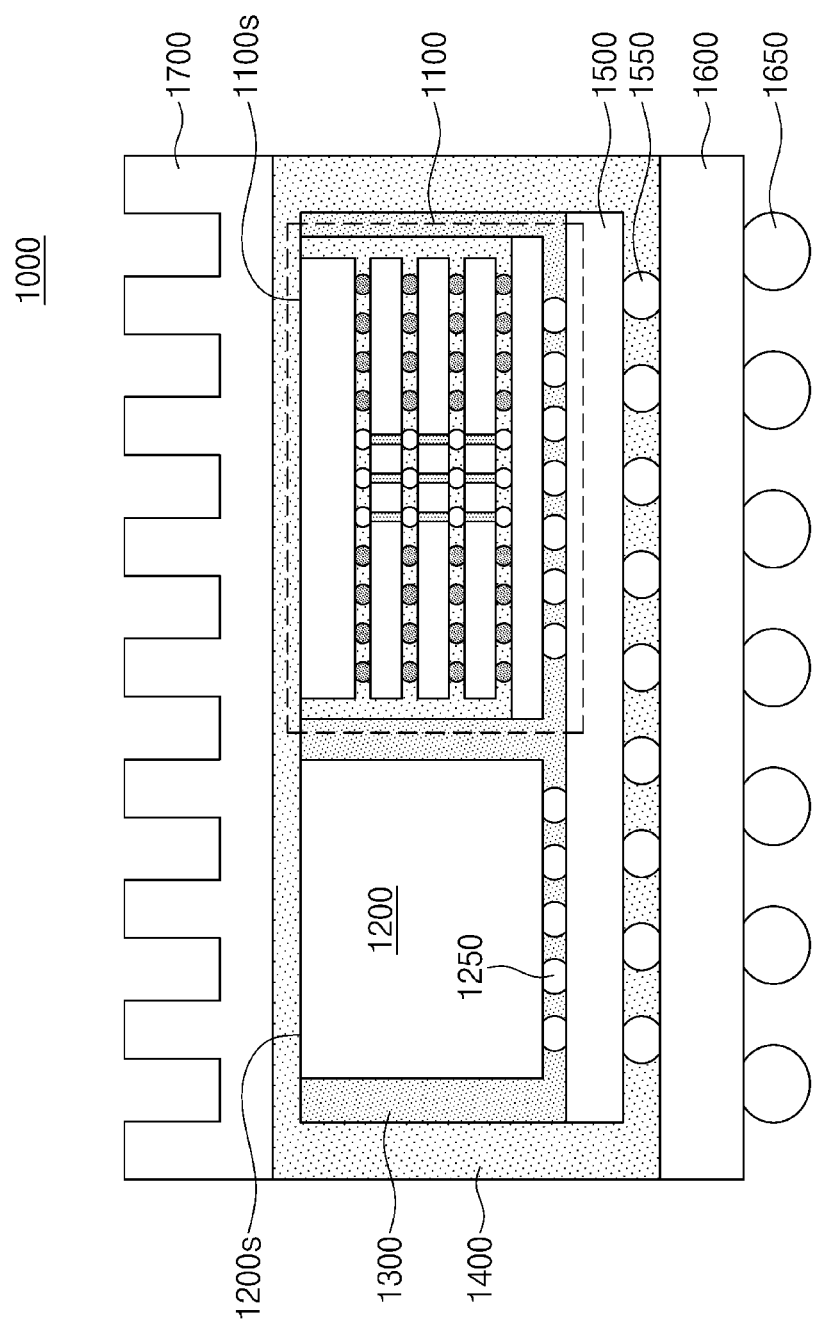
FIG. 1A is a cross-sectional view of an example of a semiconductor package having a semiconductor device according to the inventive concept.

FIG. 1A illustrates an example of a semiconductor package 1000 according to the inventive concept.

Referring to FIG. 1A, the semiconductor package 1000 may be a high bandwidth memory (HBM) module including a package substrate 1600, a chip stack 1100 and an integrated circuit chip 1200 that are mounted on the package substrate 1600, and an external molding layer 1400 encapsulating the chip stack 1100 and the integrated circuit chip 1200.

The semiconductor package 1000 may further include an interposer 1500 provided on the package substrate 1600. The interposer 1500 may electrically connect chip stack 1100 and the integrated circuit chip 1200 to each other and to the package substrate 1600. The semiconductor package 1000 may further include a heat radiation plate 1700 provided on the external molding layer 1400. The heat radiation plate 1700 may discharge heat generated in the semiconductor package 1000 to the outside.

The package substrate 1600 may be a printed circuit board and may include a plurality of external terminals 1650. A plurality of connection terminals 1550 may be provided between the interposer 1500 and the package substrate 1600 and by which the interposer 1500 and the package substrate 1600 are electrically connected to each other.

The integrated circuit chip 1200 may include a central processing unit (CPU), a graphic processing unit (GPU), a system-on-chip (SoC), or the like. A plurality of internal terminals 1250 may be provided between the integrated circuit chip 1200 and the interposer 1500. The integrated circuit chip 1200 may be electrically connected through the internal terminals 1250 to the interposer 1500 and the chip stack 1100.

The integrated circuit chip 1200 and the chip stack 1100 may be encapsulated by an internal molding layer 1300 provided on the interposer 1500. Alternatively, the internal molding layer 1300 may be omitted and the external molding layer 1400 may encapsulate the integrated circuit chip 1200 and the chip stack 1100 instead. A top surface 1200s of the integrated circuit chip 1200 and a top surface 1100s of the chip stack 1100 may be located at the same level as each other or at different levels from each other. For example, the top surface 1200s of the integrated circuit chip 1200 and the top surface 1100s of the chip stack 1100 may be coplanar.

Figure 1B:
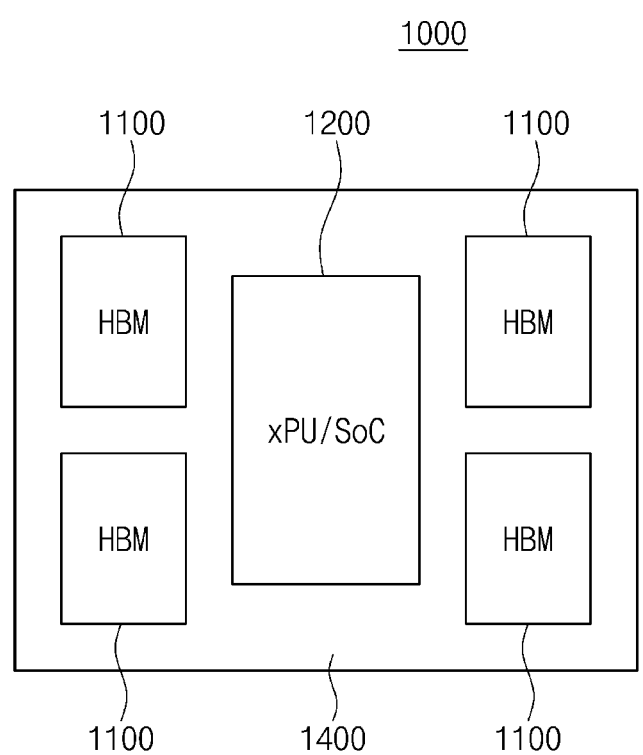
FIG. 1B is a schematic diagram or layout of an example of a semiconductor package having a semiconductor device according to the inventive concept.

FIG. 1B schematically illustrates an example of a semiconductor package according to the inventive concept.

Referring to FIG. 1B, a plurality of the chip stacks 1100 may be provided. For example, two chip stacks 1100 may be disposed adjacent one another on each of opposing sides of the integrated circuit chip 1200. Each chip stack 1100 may include a plurality of semiconductor devices vertically stacked on a buffer device, and will be discussed below with reference to FIG. 2A. Each semiconductor device may have a connection region and at least one device region discrete from the pad region. The active and/or passive electronic components of the semiconductor device constituting an IC of the semiconductor device reside in the device region(s) whereas vias, e.g., through electrodes, for connecting the IC to an external device reside in the connection region. The connection region (referred to hereinafter as a "pad region") may be devoid of any electronic components (active or passive) that constitute an IC. The semiconductor package 1000 may have a bandwidth ranging from several to tens of Gbps, and may be employed in practice by graphic cards, cell phones, computers, tablets, etc.

Figure 2A:
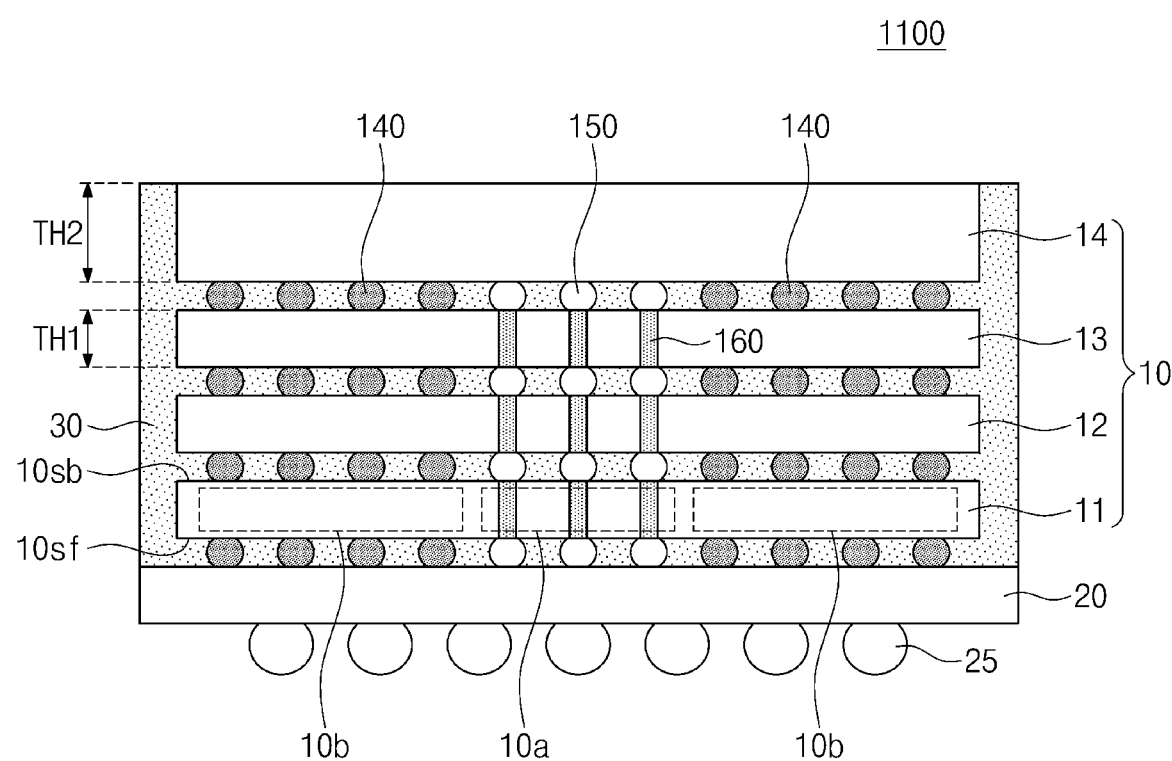
FIG. 2A is a cross-sectional view of an example of a chip stack of the semiconductor package of FIG. 1A.

FIG. 2A illustrates in detail an example of the chip stack of the semiconductor package of FIG. 1A.

Referring to FIG. 2A, the chip stack 1100 may include a buffer device 20, a plurality of semiconductor devices 10 vertically stacked on the buffer device 20, and a molding layer 30 lying on the buffer device 20 and encapsulating the semiconductor devices 10. The buffer device 20 may include a logic chip that branches signals transmitted between the buffer device 20 and the semiconductor devices 10. The buffer device 20 may be provided with a plurality of connection terminals 25 through which the buffer device 20 is electrically connected to the interposer 1500 of the semiconductor package 1000 of FIG. 1A.

The semiconductor devices 10 may be semiconductor memory chips. The semiconductor devices 10 may include first, second, third, and fourth semiconductor memory chips 11, 12, 13, and 14 that are stacked on the buffer device 20. Each of the first to fourth semiconductor memory chips 11 to 14 may have a front surface 10sf and a back surface 10sb. The front surface 10sf may correspond to an active surface of the chip, and the back surface 10sb may correspond to an inactive surface of the chip. Each of the first to fourth semiconductor memory chips 11 to 14 may be disposed in such a way that the front surface 10sf of the chip body thereof faces the buffer device 20.

The first to fourth semiconductor memory chips 11 to 14 may have the same thickness or different thicknesses. For example, the first to third semiconductor memory chips 11 to 13 may have the same first thickness TH1, and the fourth semiconductor memory chip 14 may have a second thickness TH2 greater than the first thickness TH1. Alternatively, all of the first to fourth semiconductor memory chips 11 to 14 may have the first thickness TH1 or the second thickness TH2.

Each of the first to fourth semiconductor memory chips 11 to 14 may include a pad region 10a provided with a plurality of through electrodes 160 and a cell region 10b provided with a memory cell array. No through electrodes 160 may be provided in the pad region 10a of the fourth semiconductor memory chip 14. The through electrodes 160 may electrically connect the first to fourth semiconductor memory chips 11 to 14 to one another, and also electrically connect the first semiconductor chip 11 to the buffer device 20. The through electrodes 160 may be electrically connected to the memory cells (102 in FIG. 3A) provided in the cell region 10b.

A plurality of electrical micro-bumps 150 and a plurality of dummy micro-bumps 140 may be provided at the front surface 10sf of each of the first to fourth semiconductor memory chips 11 to 14. The electrical micro-bumps 150 may be directly or indirectly coupled to the through electrodes 160. The dummy micro-bumps 140 may be electrically isolated from each of the first to fourth semiconductor memory chips 11 to 14 and the buffer device 20. The dummy micro-bumps 140 of each of the first to fourth semiconductor memory chips 11 to 14 may be thermal bumps that discharge heat generated in respective memory chip to the exterior of the memory chip.

Figure 2B:
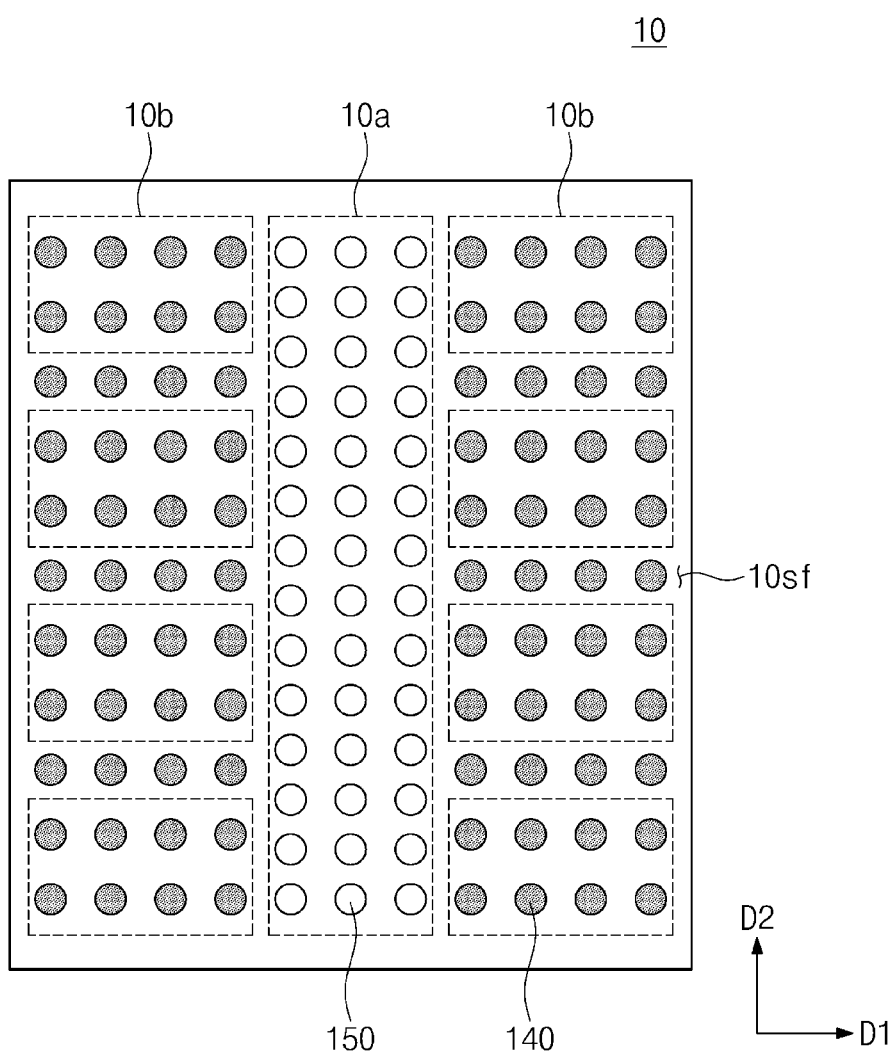
FIG. 2B is a plan view of an example of a semiconductor device according to the inventive concept.
Figure 2C:
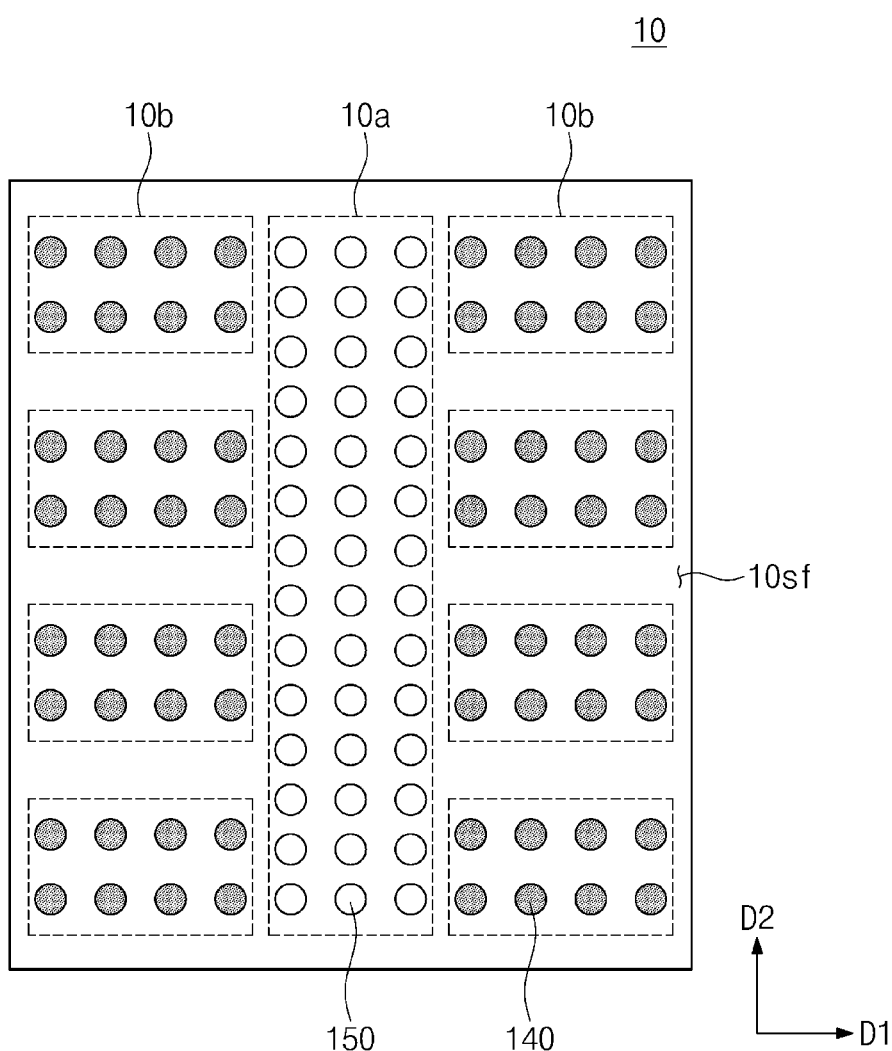
FIG. 2C is a plan view of another example of a semiconductor device according to the inventive concept.

FIGS. 2B and 2C show respective examples of the layout of micro-bumps of the semiconductor device 10 according to the inventive concept.

Referring to FIG. 2B, the pad region 10a may extend lengthwise along a second direction D2 running across a center of the semiconductor device 10. The electrical micro-bumps 150 may be provided in the pad region 10a. A plurality of cell regions 10b may be provided and the cell regions 10b may be disposed along the second direction D2 on opposite sides of the pad region 10a. Also, each of the cell regions 10b may be extend lengthwise in a first direction D1 adjacent a side of the pad region 10a, which first direction D1 intersects the second direction D2, e.g., is perpendicular to the second direction D2.

The dummy micro-bumps 140 may be uniformly disposed across a region of the semiconductor device 10 constituted by the cell regions 10b and all other regions besides the pad region 10a. The electrical micro-bumps 150 may have a density the same as or different from that of the dummy micro-bumps 140. For example, the density of the electrical micro-bumps 150 may be greater than the density of the dummy micro-bumps 140.

Referring to FIG. 2C, in this example the dummy micro-bumps 140 are concentrated mainly on a hot spot where the majority of heat is generated in the semiconductor device 10. For example, the dummy micro-bumps 140 may be concentrated in the cell regions 10b and may not be present in regions between or around the cell regions 10b.

As illustrated in FIG. 2B or 2C, the electrical micro-bumps 150 may be disposed at the front surface 10sf of the chip body in the pad region 10a, and the dummy micro-bumps 140 may be disposed at the front surface 10sf of the chip body in the cell region 10b. The front surface 10sf of the semiconductor device 10 may be a planarized surfaced. The planarized front surface 10sf may prevent light from scattering therefrom when a photolithography process is performed, which may in turn prevent the micro-bumps 140 and 150 from being formed with abnormal shapes. This will be further discussed below with reference to FIGS. 3A to 3G.

FIGS. 3A to 3G illustrate an example of a method of fabricating a semiconductor device according to the inventive concept. In the description that follows, the cell region 10b of the semiconductor device 10 shown in FIG. 2A will be focused on. The following description may be identically or similarly apply to the pad region 10a of the semiconductor device 10.

Figure 3A:
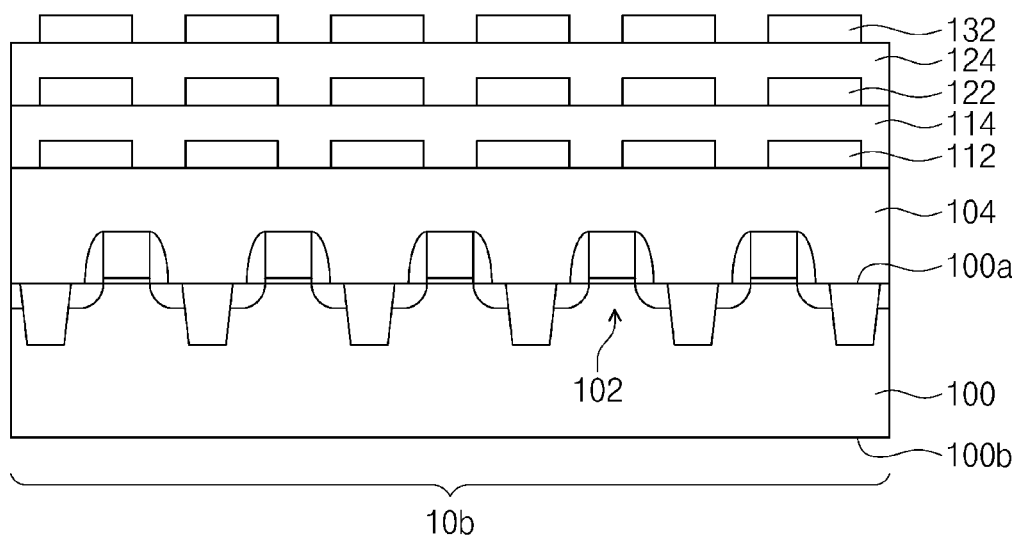
FIGS. 3A, 3B, 3C, 3D 3E, 3F and 3G are cross-sectional views of a semiconductor device during the course of its manufacture and collectively illustrate an example of a method of fabricating a semiconductor device according to the inventive concept.

Referring to FIG. 3A, a semiconductor substrate 100 may be provided thereon with a memory cell 102 and an interlayer dielectric layer 104 covering the memory cell 102. The semiconductor substrate 100 may be a silicon wafer, a germanium wafer, a silicon-germanium wafer, or a compound wafer, each of which has an active surface 100a and an inactive surface 100b opposite to the active surface 100a. A memory cell 102 may be formed by forming one or more transistors on the active surface 100a of the semiconductor substrate 100. The interlayer dielectric layer 104 may be formed by depositing an insulating material, such as a silicon oxide or a silicon nitride, on the semiconductor substrate 100.

The memory cell 102 may include a memory component such as a capacitors electrically connected to a transistor. As illustrated in FIG. 2A, the pad region 10a may be provided thereon with the through electrodes 160 electrically connected to the memory cell 102. The through electrodes 160 extends through the semiconductor substrate 100.

Figure 3B:
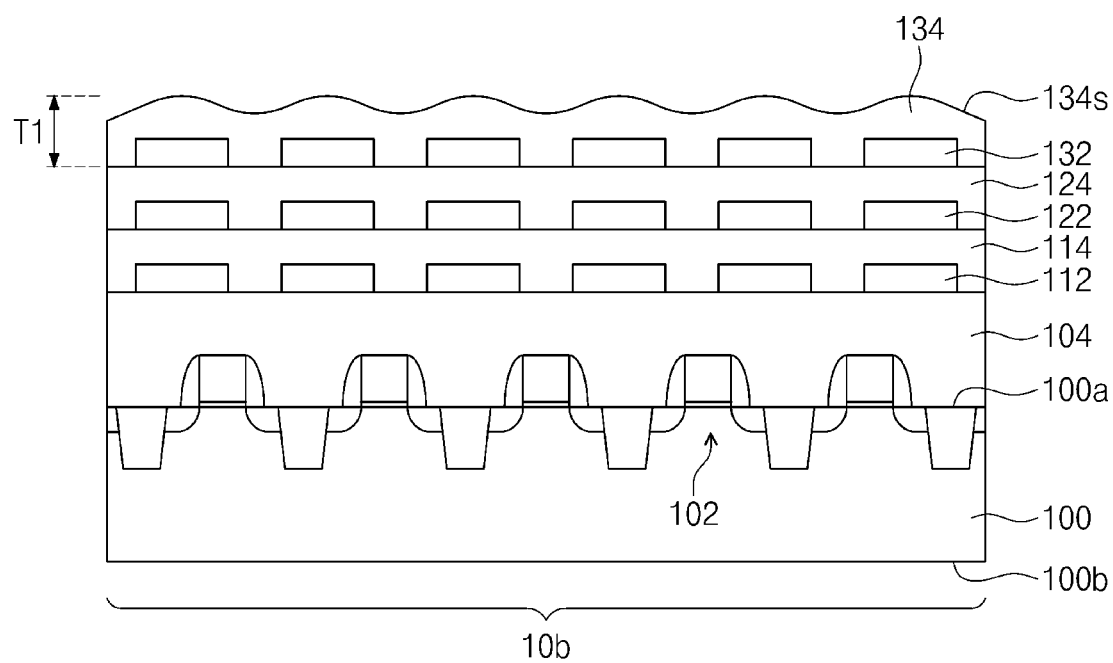

Referring to FIG. 3B, the interlayer dielectric layer 104 may be provided thereon with lower metal lines 112 and a lower intermetal dielectric layer 114 covering the lower metal lines 112. The lower metal lines 112 may comprise copper or aluminum. The lower intermetal dielectric layer 114 may be formed by depositing an insulating material such as a silicon oxide or a silicon nitride on the on the interlayer dielectric layer 104.

The lower intermetal dielectric layer 114 may be provided thereon with upper metal lines 132 and a passivation layer 134 (referred to hereinafter as a first or lower section of the passivation layer) covering the upper metal lines 132. Optionally, the lower intermetal dielectric layer 114 may further be provided thereon with intermediate metal lines 122 and an intermediate intermetal dielectric layer 124 covering the intermetal metal lines 122. The intermediate metal lines 122 may comprise copper or aluminum. The intermediate intermetal dielectric layer 124 may be formed by depositing an insulating material such as a silicon oxide or a silicon nitride on the lower intermetal dielectric layer 114 provided with upper metal lines 132.

The first passivation layer 134 may be formed by depositing an insulating material, such as a silicon oxide, a silicon nitride, or a photosensitive polyimide (PSPI), on the lower intermetal dielectric layer 114 provided with upper metal lines 132. For example, the first passivation layer 134 may be a silicon nitride layer. The first passivation layer 134 may have a profile dictated by the arrangement (i.e., the topography) of the upper metal lines 132 embedded therein, thereby having a non-planar top surface 134s. For example, the top surface 134s of the first passivation layer 134 may have convexities on the upper metal lines 132 and concavities between the upper metal lines 132, e.g., may have a wavy or undulating upper surface. The first passivation layer 134 may have an average thickness T1 ranging from several to tens of μm, e.g., from about 1 μm to about 20 μm. A planarization process is not performed on the top surface 134s of the first passivation layer 134.

Figure 3C:
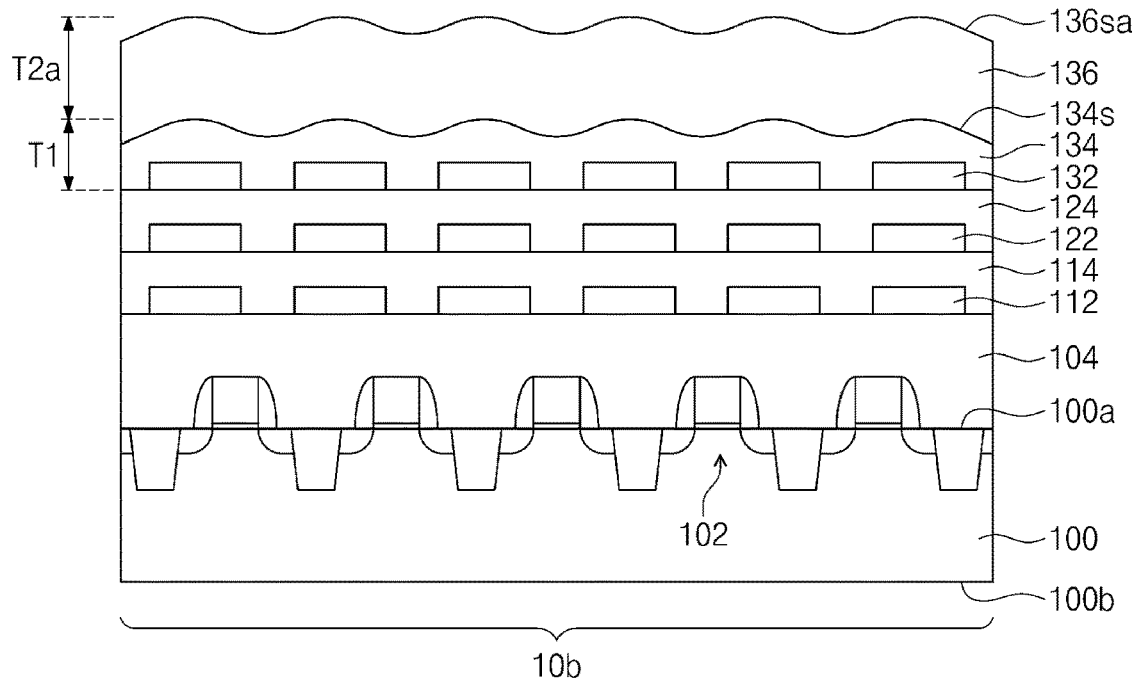

Referring to FIG. 3C, a passivation layer 136 (referred to hereinafter as a second or upper section of the passivation layer) may be formed on the first passivation layer 134. The second passivation layer 136 may be formed by depositing an insulating material such as a silicon oxide, a silicon nitride, or a photosensitive polyimide (PSPI), on the first passivation layer 134. For example, the second passivation layer 136 may be a silicon oxide layer. The second passivation layer 136 may have a non-planar initial top surface 136sa because it is formed on the first passivation layer 134. The second passivation layer 136 may have an initial average thickness T2a ranging from several to tens of μm, e.g., from about 1 μm to about 40 μm.

Figure 3D:
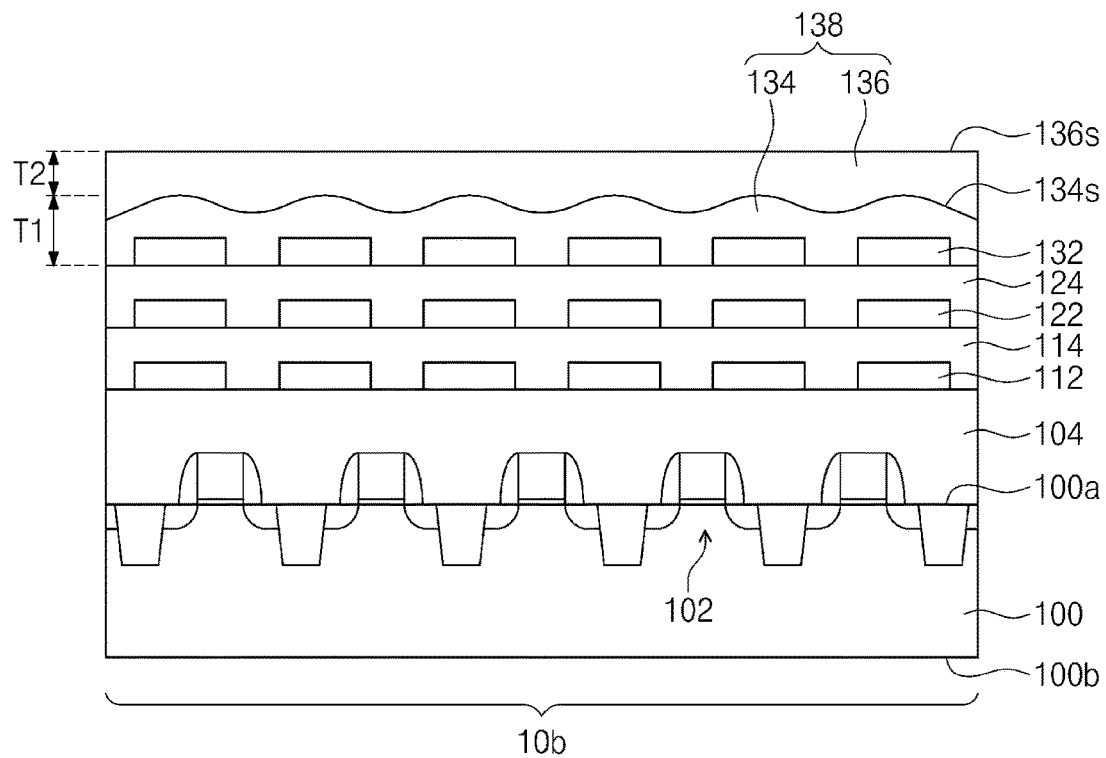

Referring to FIG. 3D, a planarization process may be performed on the second passivation layer 136. For example, a chemical mechanical polishing process may be performed to planarize the second passivation layer 136. The second passivation layer 136 may then have a planar top surface 136s.

The planarization process may cause the second passivation layer 136 to have an average thickness T2 less than the initial average thickness T2a. The average thickness T2 of the second passivation layer 136 may fall within a range from several to tens of μm, e.g., equal to or less than about 20 μm, and more narrowly, from about 0.1 μm to about 5 μm.

Accordingly, a passivation layer 138 may be formed to have a double-layered structure including the first and second passivation layers 134 and 136. The planarized top surface 136s of the second passivation layer 136 may provide a planar top surface of the passivation layer 138. The top surface 134s of the first passivation layer 134 may provide a non-planar interface between the first passivation layer 134 and the second passivation layer 136.

As discussed above, the first and second passivation layers 134 and 136 may be formed of a silicon oxide layer, a silicon nitride layer, or a photosensitive polyimide (PSPI) layer. For example, the first passivation layer 134 may be formed of a silicon nitride layer (e.g., SiNx) having relatively excellent dielectric characteristics and strength, and the second passivation layer 136 may be formed of a silicon oxide layer (e.g., $SiO_2$) which can be easily be polished by a chemical mechanical polishing conventional per se. Alternatively, the first and second passivation layers 134 and 136 may be formed of the same material, e.g., a silicon nitride layer or a silicon oxide layer.

Figure 3E:
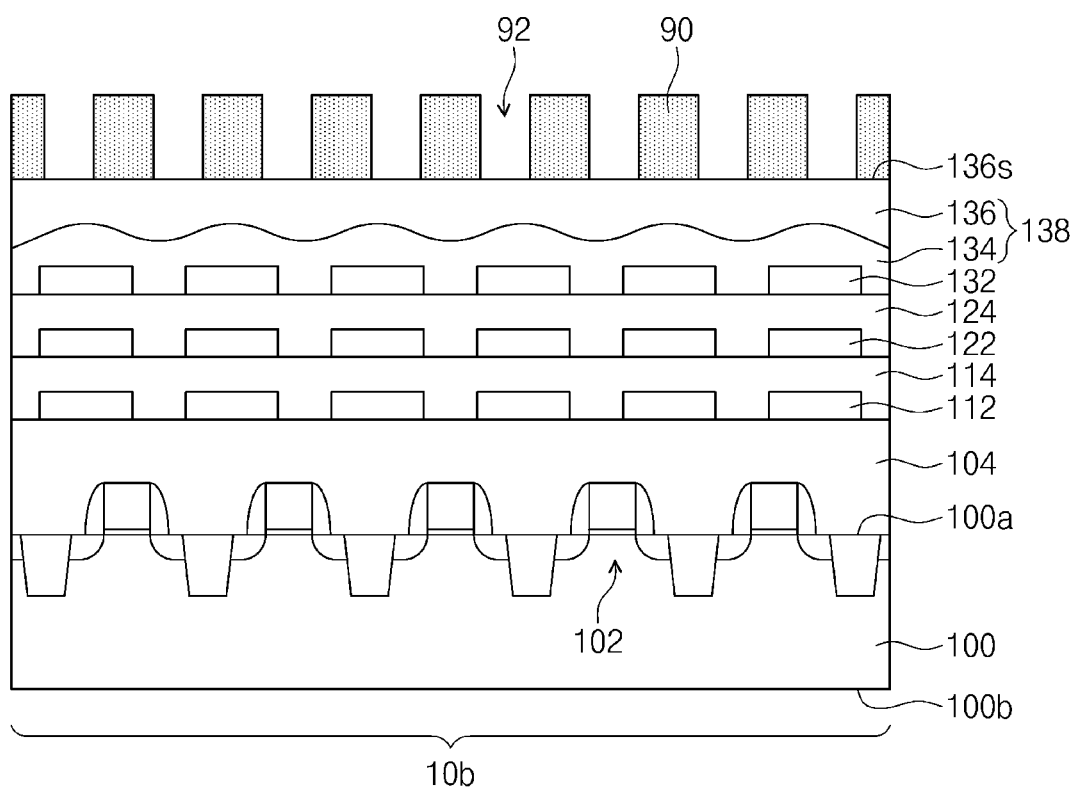

Referring to FIG. 3E, a mask pattern 90 may be formed on the passivation layer 138. For example, the passivation layer 138 may be coated with a photoresist and then photolithography and etching processes may be performed on the coating (layer) of photoresist, with the result that the mask pattern 90 has a plurality of openings 92. The openings 92 may expose the planarized top surface 136s of the second passivation layer 136. Because the second passivation layer 136 has the planar top surface 136s, scattered reflection of light may be reduced or prevented when the photolithography process is performed. Accordingly, the mask pattern 90 may be formed to have desirably shaped openings 92.

Figure 3F:
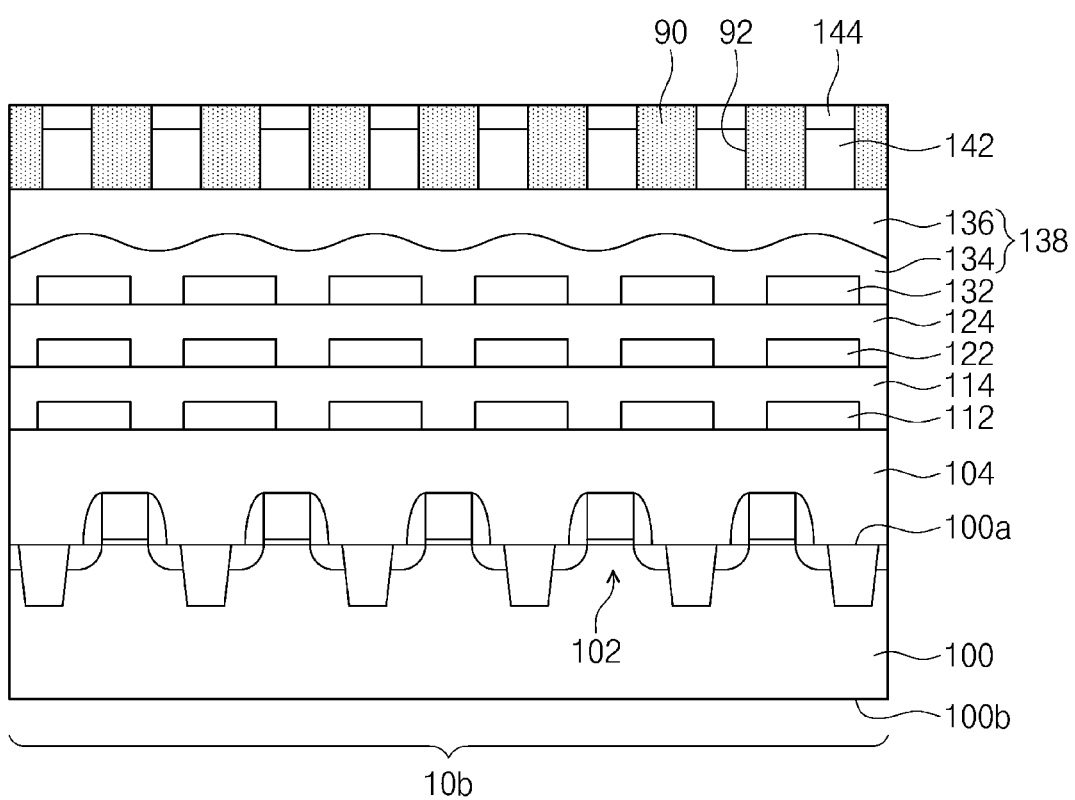

Referring to FIG. 3F, a metal pillar 142 and a capping layer 144 may be formed in each of the openings 92. For example, the exposed portions of the planarized top surface 136s of the second passivation layer 136 may be plated with metal such as copper or aluminum or the metal may be deposited in the openings 92 to form the metal pillars 142 that partially fill the opening 92. Then metal pillars 142 may be plated with solder or solder may be deposited in the remainder of the openings 92 to form the capping layers 144 that fill the remaining portions of the openings 92. When a plating process is performed, a seed layer including metal may further be formed in the openings 92.

Figure 3G:
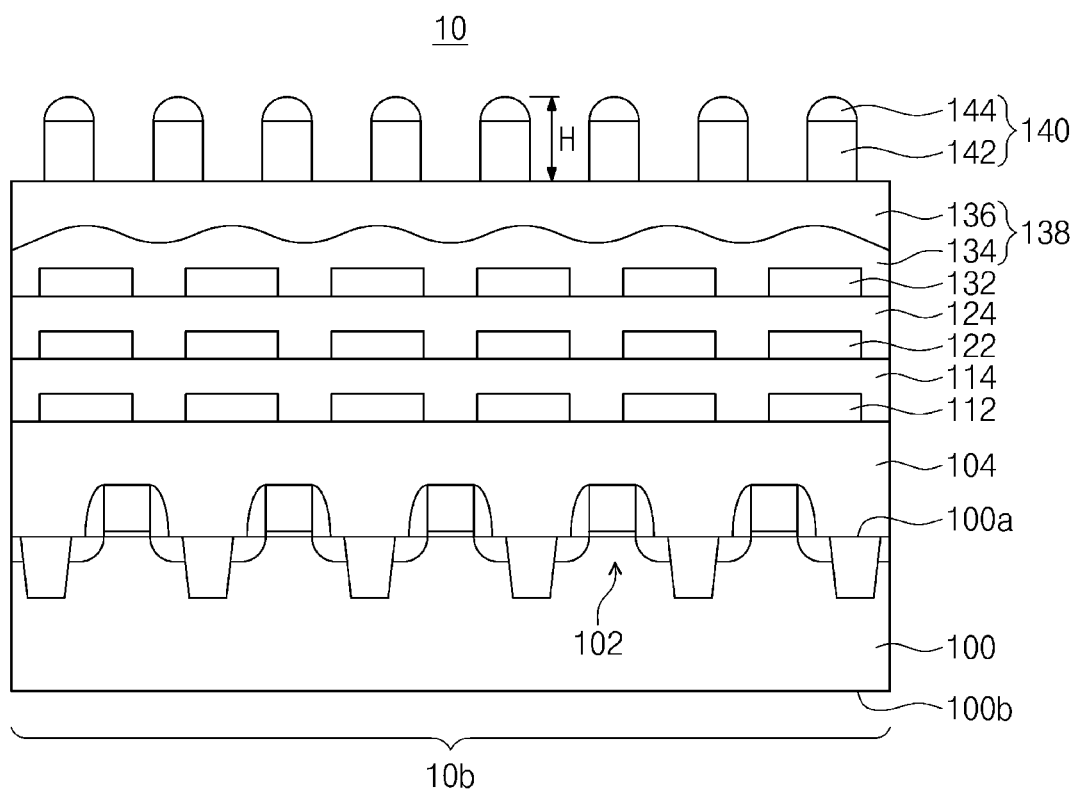

Referring to FIG. 3G, the mask pattern 90 may be removed, and then a reflow process may be performed. The reflow process may cause the capping layer 144 to have a substantially spherical or semi-spherical shape. As a result, a semiconductor device 10 may be fabricated to have on the passivation layer 138 a plurality of dummy micro-bumps 140 each of which includes a metal pillar 142 and a capping layer 144.

As illustrated in FIG. 2A, a plurality of electrical micro-bumps 150 may be formed on the pad region 10a of the semiconductor device 10, which electrical micro-bumps 150 are electrically connected to the through electrodes 160. The electrical micro-bumps 150 may have a density the same as or different from that of the dummy micro-bumps 140. For example, the density of the electrical micro-bumps 150 may be greater than the density of the dummy micro-bumps 140.

The dummy micro-bumps 140, as the word "dummy" indicates to those in the art, do not form any electrical connection in or for the semiconductor device 10. In this example, the dummy micro-bumps 140 serve as heat sinks that radiate heat generated in the semiconductor device 10, which heat is generated mainly in the memory cell 102. Each dummy micro-bump 140 may have a height H ranging from several to hundreds of μm, e.g., from about 5 μm to about 100 μm.

A large number of the dummy micro-bumps is desirable to maximize heat radiation characteristics of the semiconductor device 10. If the top surface 136s of the second passivation layer 136 were non-planar, the mask pattern 90 having the number of openings corresponding to the number of dummy micro-bumps to be formed would have an undesirable shape caused by scattered reflection of light when the photolithography process used to form the mask pattern is performed. This could cause abnormally shaped dummy micro-bumps to be formed.

On the other hand, according to an aspect of the inventive concept, as discussed above with reference to FIG. 3E, the second passivation layer 136 has a planarized, i.e., planar, top surface 136s. When the mask pattern 90 is formed on the planarized top surface 136s of the second passivation layer 136, the mask pattern 90 may be free of the influence of scattered reflection of light when a photolithography process is performed. Therefore, mask pattern 90 may have desirably shaped openings 92, and as illustrated in FIGS. 3F and 3G, the openings 92 may facilitate the forming (therein) of the dummy micro-bumps 140 of prescribed shapes designed to radiate heat most effectively.

Figure 4A:
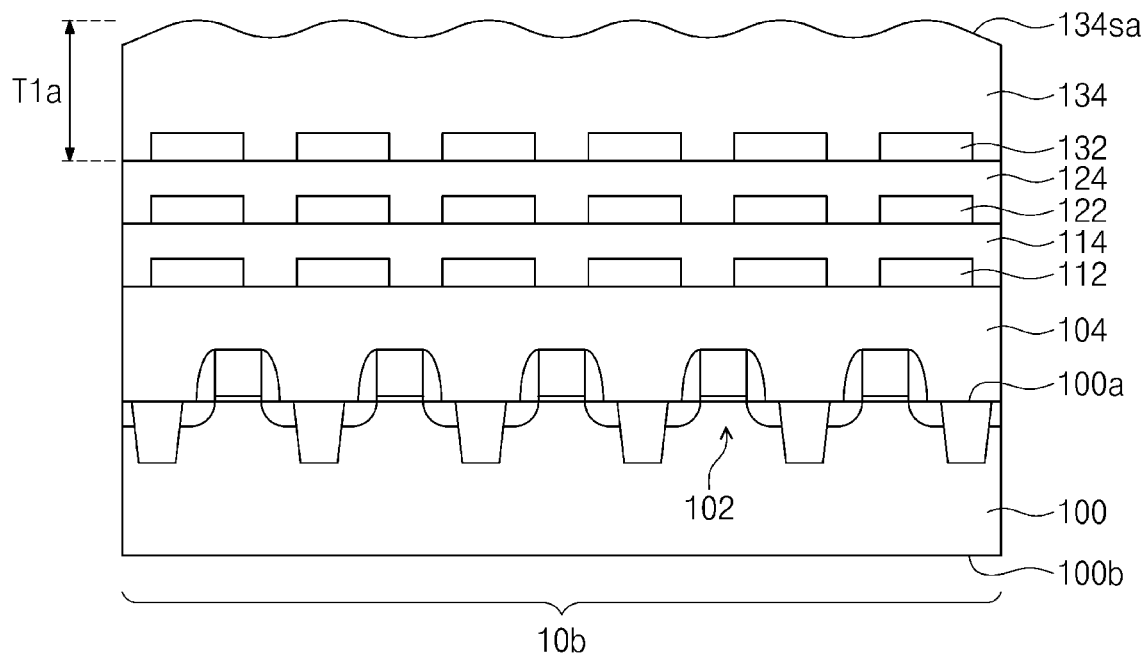
FIGS. 4A, 4B and 4C are cross-sectional views of a semiconductor device during respective stages in the course of its manufacture and illustrate another example of a method of fabricating a semiconductor device according to the inventive concept.
Figure 4B:
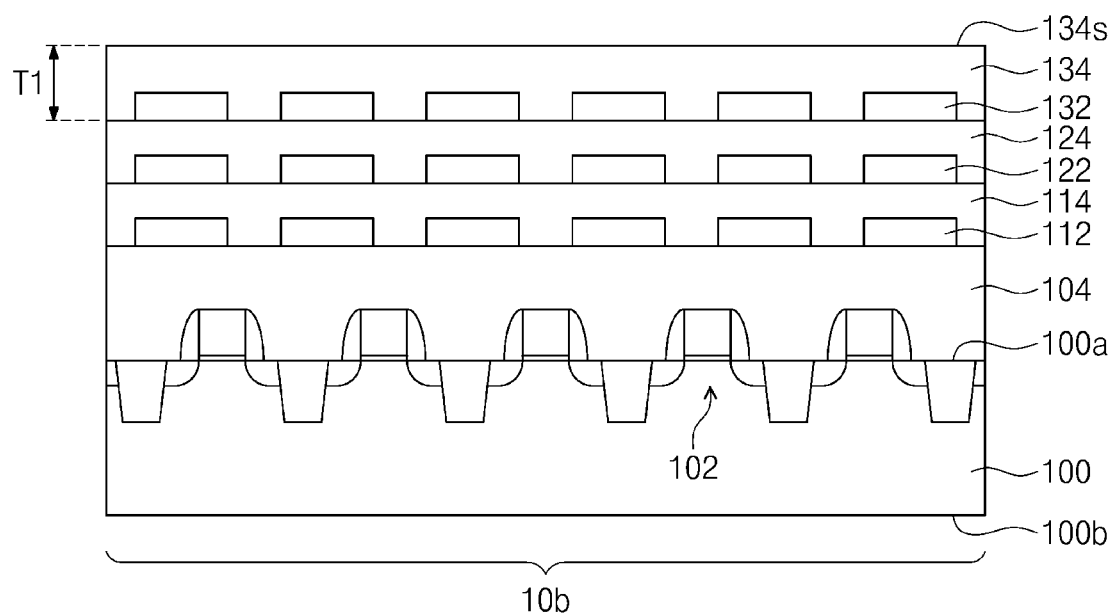
Figure 4C:
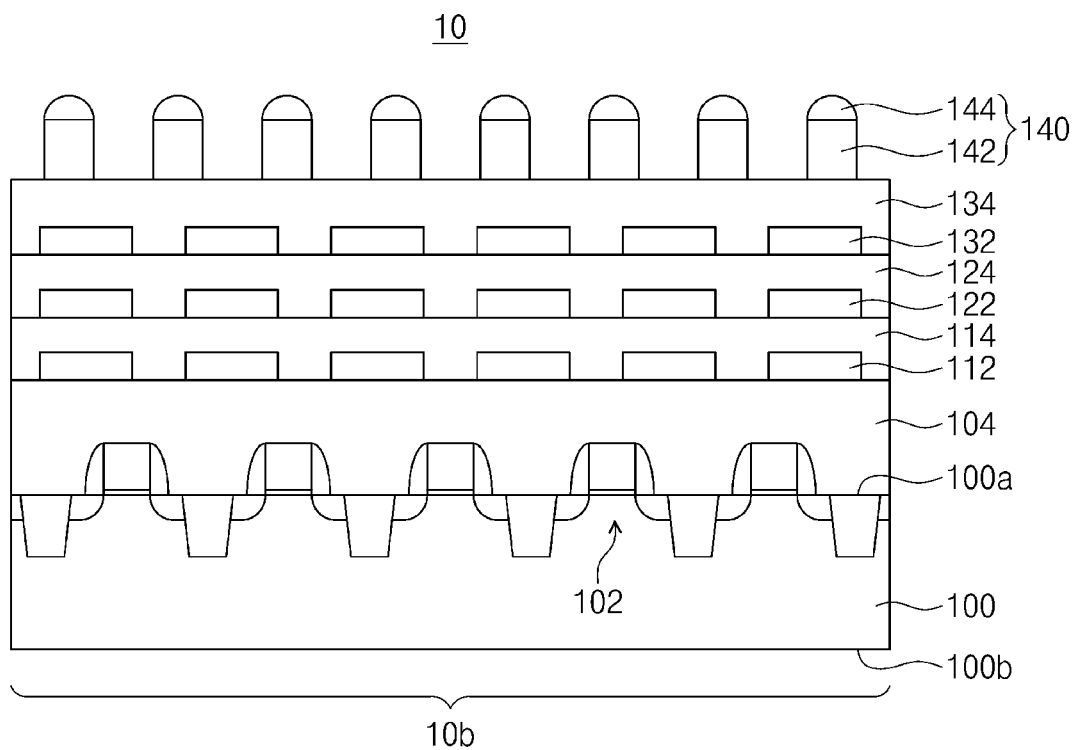

FIGS. 4A to 4C illustrate another example of a method of fabricating a semiconductor device, according to the inventive concept.

Referring to FIG. 4A, processes similar to those discussed above with reference to with FIG. 3A may be performed to form the upper metal line 132 on the active surface 100a of the semiconductor substrate 100 having the memory cell 102. A passivation layer 134 may be formed to have a non-planar initial top surface 134sa, covering the upper metal lines 132. The passivation layer 134 may be a silicon oxide layer, a silicon nitride layer, or a photosensitive polyimide (PSPI) layer. For example, the passivation layer 134 may be a silicon nitride layer having an initial average thickness T1a. The initial average thickness T1a may fall within a range from several to tens of μm, e.g., from more than 1 μm to about 40 μm.

Referring to FIG. 4B, the passivation layer 134 may be planarized. For example, a chemical mechanical polishing process may be performed to planarize the passivation layer 134. The passivation layer 134 may then have a planar top surface 134s. The planarization process may cause the passivation layer 134 to have an average thickness T1 less than the initial average thickness T1a. The average thickness T1 may fall within a range from several to tens of μm, e.g., from more than 1 μm to about 20 μm, and more narrowly, from more than 1 μm to about 10 μm.

Referring to FIG. 4C, the processes discussed above with reference to FIGS. 3E and 3F may be performed to form dummy micro-bumps 140 on the passivation layer 134. As discussed above with reference to FIG. 4B, at this state, the passivation layer 134 has a planar top surface 134s; therefore, the dummy micro-bumps 140 may have the prescribed (desired) shapes free from abnormalities.

According to the inventive concept, a top surface of a passivation layer may be planar. Therefore, a plurality of dummy micro-bumps may be formed on the planar top surface of the passivation layer using a photolithography process, without abnormalities occurring in the shapes of the dummy micro-bumps. As a result, a semiconductor device may have excellent heat dissipation and electrical characteristics.

This detailed description the inventive concept should not be construed as limited to the examples described herein. Rather, various combinations, modifications and variations of the examples described herein are within the spirit and scope of inventive concept as set forth in the appended claims.

What is claimed is:

1. A semiconductor device having a pad region and at least one cell region discrete from the pad region, and comprising:
    a semiconductor substrate having an active surface and an inactive surface opposite to the active surface;
    an arrangement of a plurality of metal lines on the active surface of the semiconductor substrate;
    a plurality of bumps in the at least one cell region;
    a first passivation layer covering the plurality of metal lines and having a non-planar top surface having a profile dictated by the arrangement of the plurality of metal lines; and
    a second passivation layer on the non-planarized top surface of the first passivation layer and having a planar top surface, wherein the plurality of bumps are disposed on the planar top surface of the second passivation layer, and wherein the plurality of bumps comprise a plurality of dummy micro-bumps electrically isolated in the semiconductor device.

2. The semiconductor device of claim 1, wherein the first passivation layer and the second passivation layer are respective insulating materials and the insulating materials have different compositions from one another.

3. The semiconductor device of claim 2, wherein the first passivation layer comprises a silicon nitride layer, and the second passivation layer comprises a silicon oxide layer.

4. The semiconductor device of claim 1, further comprising a plurality of through electrodes extending though the semiconductor substrate in the pad region of the semiconductor device, wherein none of the plurality of bumps are electrically connected to any of the plurality of through electrodes.

5. The semiconductor device of claim 4, further comprising a plurality of electrical bumps on the second passivation layer in the pad region of the semiconductor device and electrically connected to the plurality of through electrodes.

6. The semiconductor device of claim 1, wherein the pad region extends linearly across a center of the semiconductor substrate as viewed in a plan view, and the at least one cell region comprises a plurality of cell regions on opposite sides of the pad region.

7. A semiconductor device having a pad region and at least one cell region discrete from the pad region, and comprising:

a semiconductor substrate having an active surface and an inactive surface opposite to the active surface;

a plurality of metal lines on the active surface of the semiconductor substrate;

a plurality of bumps in the at least one cell region;

a first passivation layer covering the plurality of metal lines and including a first insulating material; and a second passivation layer including a second insulating material and having a planar top surface, the second insulating material having a composition different than a composition of the first insulating material, wherein the plurality of bumps are disposed on the planar top surface of the second passivation layer, the first passivation layer and the second passivation layer have an interface that is non-planar, and wherein the plurality of bumps are uniformly disposed in the at least one cell region and are thermal micro-bumps that are electrically isolated from circuitry in the at least one cell region of the semiconductor device.

8. The semiconductor device of claim 7, wherein the first insulating material of the first passivation layer comprises silicon oxide, and the second insulating material of the second passivation layer comprises silicon nitride.

9. The semiconductor device of claim 7, comprising a memory cell in the at least one cell region of the semiconductor device, and through electrodes extending through the semiconductor substrate in the pad region of the semiconductor device.

10. The semiconductor device of claim 9, further comprising a plurality of electrical bumps on the second passivation layer, situated in the pad region of the semiconductor device, and electrically connected to the through electrodes.

11. The semiconductor device of claim 7, wherein the plurality of bumps are disposed directly on the planar top surface of the second passivation layer.

12. The semiconductor device of claim 7, wherein each of the plurality of bumps comprises:

a metal pillar on the planar top surface of the second passivation layer; and a capping layer covering the metal pillar.

13. The semiconductor device of claim 7, wherein, on the plurality of metal lines, the interface is convex toward the plurality of bumps, and wherein, between the plurality of metal lines, the interface is concave towards the semiconductor substrate.

14. A semiconductor device having at least one device region in which integrated circuitry of the semiconductor device is provided, and a connection region discrete from the at least one device region and devoid of passive and active electronic components, and comprising:

a semiconductor substrate having an active surface and an inactive surface opposite to the active surface;

metal lines disposed over an upper surface of the semiconductor substrate in the at least one device region;

a first passivation layer covering the metal lines, the first passivation layer having a non-planar top surface situated over the metal lines;

a second passivation layer on the first passivation layer and having a planar top surface;

through electrodes extending in the semiconductor substrate in the connection region and electrically connected to the integrated circuitry; and dummy micro-bumps disposed on the planar top surface of the second passivation layer over the integrated circuitry in the at least one device region, the dummy micro-bumps electrically isolated from the integrated circuitry and the through electrodes.

15. The semiconductor device of claim 14, wherein the first passivation layer and the second passivation layer comprise respective different insulating materials.

16. The semiconductor device of claim 15, wherein the first passivation layer comprises a silicon nitride layer, and the second passivation layer comprises a silicon oxide layer.

17. The semiconductor device of claim 14, further comprising first micro-bumps disposed on the planar top surface of the second passivation layer in the connection region, the first micro-bumps electrically connected to the through electrodes.

18. The semiconductor device of claim 14, wherein the dummy micro-bumps are uniformly disposed over the at least one device region.

19. The semiconductor device of claim 14, wherein each of the dummy micro-bumps comprises:

a metal pillar on the planar top surface of the second passivation layer; and a capping layer covering the metal pillar, the capping layer having a substantially spherical or semi-spherical shape.

20. The semiconductor device of claim 14, wherein the at least one device region comprises first and second device regions with the connection region disposed between the first and second device regions.

* * * * *